US007683666B1

(12) United States Patent  (10) Patent No.: US 7,683,666 B1
Shimanek  (45) Date of Patent: Mar. 23, 2010

(54) CIRCUIT COMPONENT WITH PROGRAMMABLE CHARACTERISTICS AND METHOD OF OPERATING SAME

(75) Inventor: Schuyler E. Shimanek, Albuquerque, NM (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 12/357,328

(22) Filed: Jan. 21, 2009

(51) Int. Cl.
*H03K 19/173* (2006.01)
(52) U.S. Cl. .......................................... 326/46; 326/93
(58) Field of Classification Search .................... 326/37, 326/38, 46, 56–58, 93–98
See application file for complete search history.

(56) References Cited

U.S. PATENT DOCUMENTS 6,680,622 B2 * 1/2004 Zounes ......................... 326/16
6,853,212 B2 * 2/2005 Chandar et al. ................ 326/16
7,391,250 B1 * 6/2008 Chuang ........................ 327/211
7,622,975 B2 * 11/2009 Hamdan et al. .............. 327/202

* cited by examiner

*Primary Examiner*—Don P Le
(74) *Attorney, Agent, or Firm*—T. Murray Smith

(57) ABSTRACT

A method and apparatus involve operating a circuit that includes a first portion and a second portion, including: operating the first portion in synchronism with a clock signal; maintaining in the first portion a logical value that can vary dynamically; and operating the second portion in a selected one of first and second operational modes. The operating of the second portion includes: responding to the occurrence of a control signal during operation in the first operational mode by causing the second portion to force the logical value in the first portion to a predetermined logical state in a manner asynchronous to the clock signal; and responding to the occurrence of the control signal during operation in the second operational mode by causing the second portion to force the logical value in the first portion to the predetermined logical state in a manner synchronized with the clock signal.

19 Claims, 4 Drawing Sheets

CIRCUIT COMPONENT WITH PROGRAMMABLE CHARACTERISTICS AND METHOD OF OPERATING SAME

FIELD OF THE INVENTION

The invention relates to integrated circuit devices (ICs). More particularly, the invention relates to circuit components with programmable characteristics in an IC.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Integrated circuits, such as PLDs, may include components that need a reset capability. In particular, an integrated circuit component may have either an asynchronous or a synchronous reset capability. In some situations a design engineer needs a component with an asynchronous reset, and in other situations needs a component with a synchronous reset. However, the component available to the designer may have a synchronous reset in a situation where a designer needs an asynchronous reset, or may have an asynchronous reset in a situation where a designer needs a synchronous reset.

Depending on design requirements, a design engineer may also need to enable and disable a clock signal. When the engineer needs both reset and clock enable/disable capabilities, the engineer often needs one of the clock and reset signals take priority over the other. For example, the engineer may not want an integrated circuit component to reset when the clock signal is disabled, or may want to reset the component when the clock signal to the integrated circuit is disabled. In the case of a typical circuit component that has both reset capability and clock enable capability, one of the reset and clock enable will inherently have priority over the other. However, the component available to the designer may give the reset priority over the clock enable in a situation where the engineer needs the clock enable to have priority over the reset, or may give the clock enable priority over the reset where the engineer needs the reset to have priority over the clock enable. Consequently, although existing components in integrated circuits have been generally adequate for their intended purposes, they have not been entirely satisfactory in all respects.

SUMMARY

Operating a circuit that includes first and second portions includes: operating the first portion in synchronism with a clock signal; maintaining in the first portion a logical value that can vary dynamically; and operating the second portion in a selected one of first and second operational modes. The operating of the second portion includes: responding to the occurrence of a control signal during operation in the first operational mode by causing the second portion to force the logical value in the first portion to a predetermined logical state in a manner asynchronous to the clock signal; and responding to the occurrence of the control signal during operation in the second operational mode by causing the second portion to force the logical value in the first portion to the predetermined logical state in a manner synchronized with the clock signal.

A circuit includes: a first portion operating in synchronism with a clock signal, and maintaining a logical value that can vary dynamically; and a second portion coupled to the first portion, having first and second operational modes, and having a third portion that causes the second portion to operate in a selected one of the first and second operational modes. In the first operational mode the second portion responds to an occurrence of a control signal by forcing the logical value to a predetermined logical state in a manner asynchronous to the clock signal. In the second operational mode the second portion responds to an occurrence of the control signal by forcing the logical value to the predetermined logical state in a manner synchronized with the clock signal.

DETAILED DESCRIPTION

Figure 1:
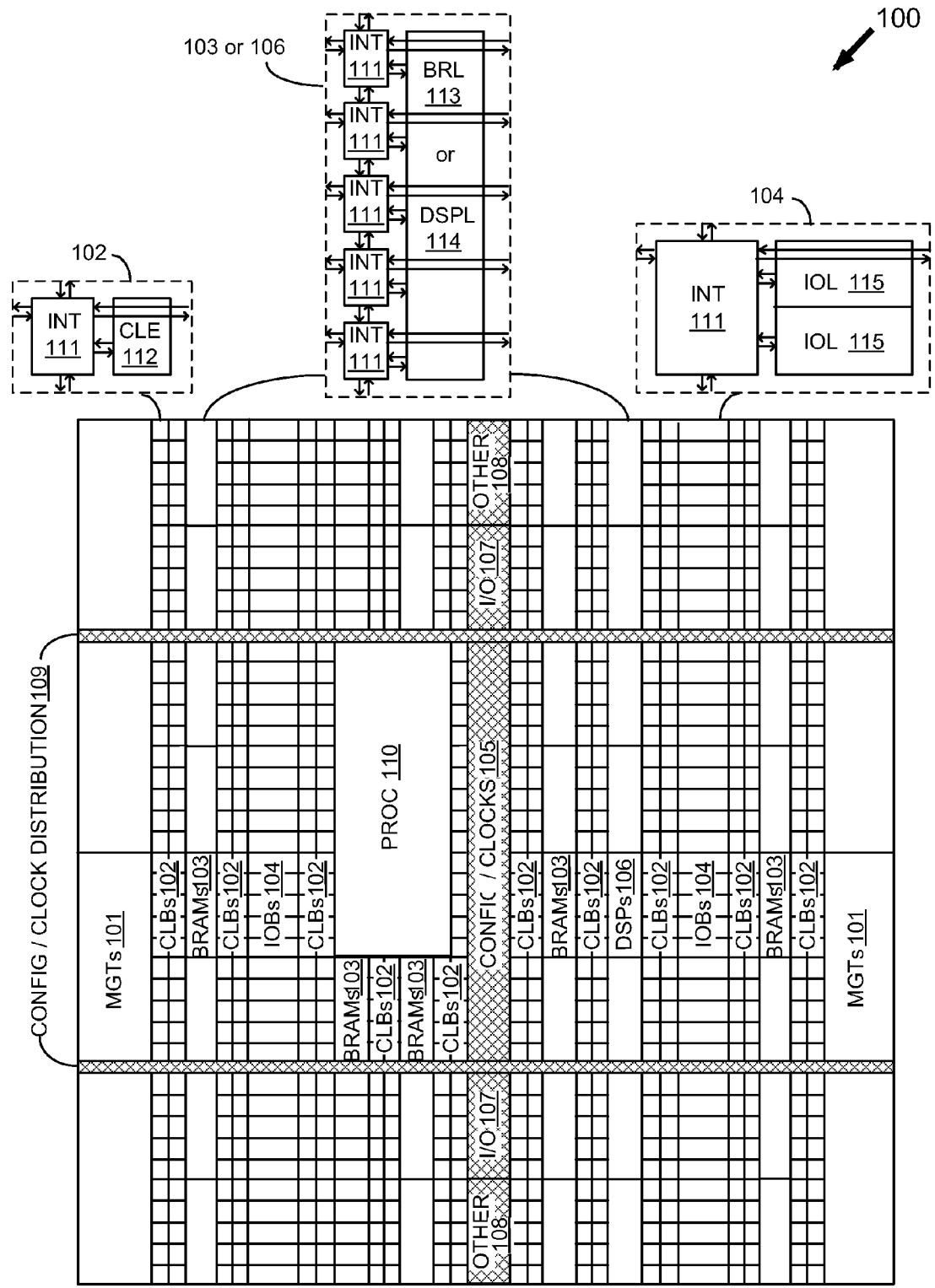
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
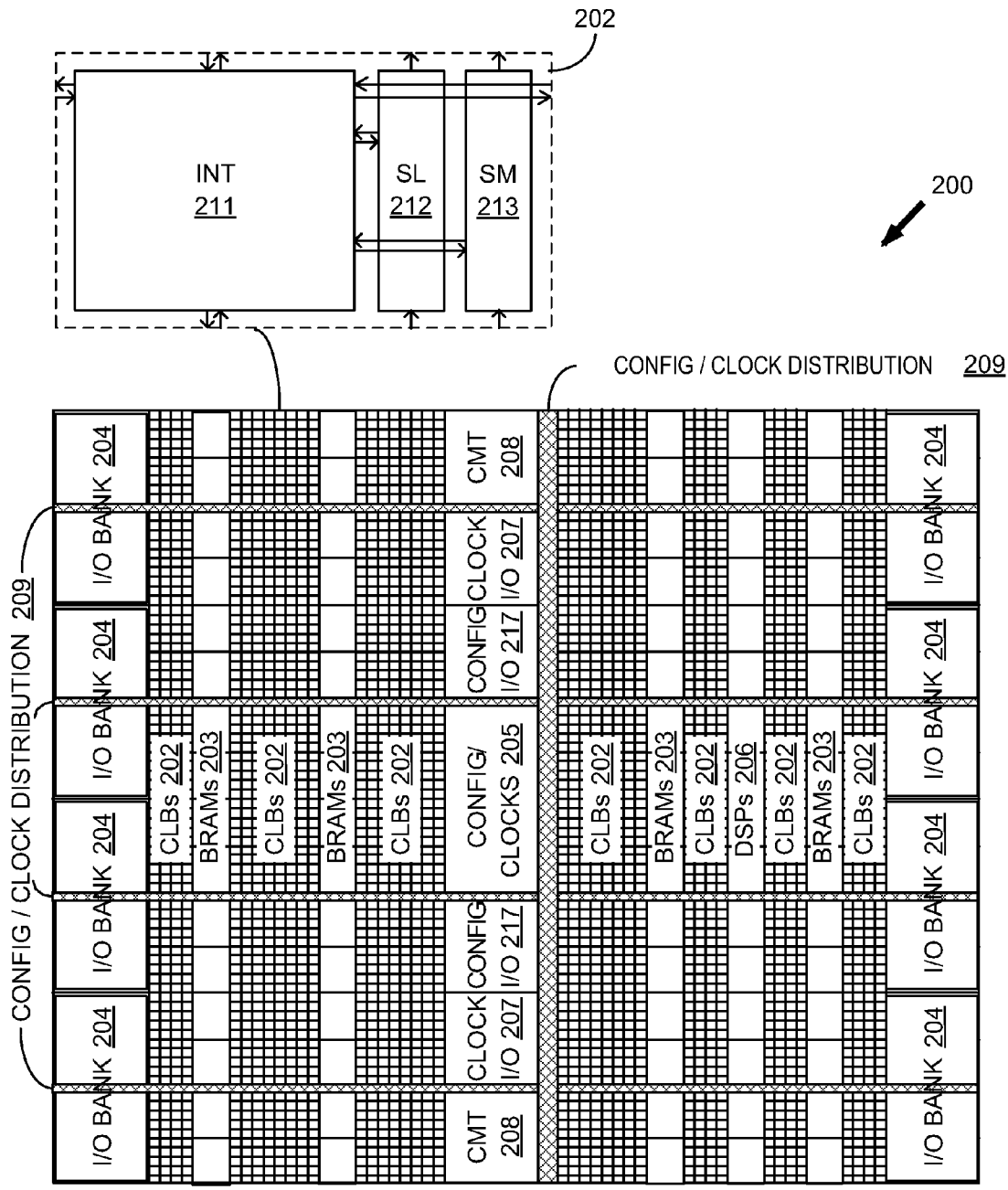
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
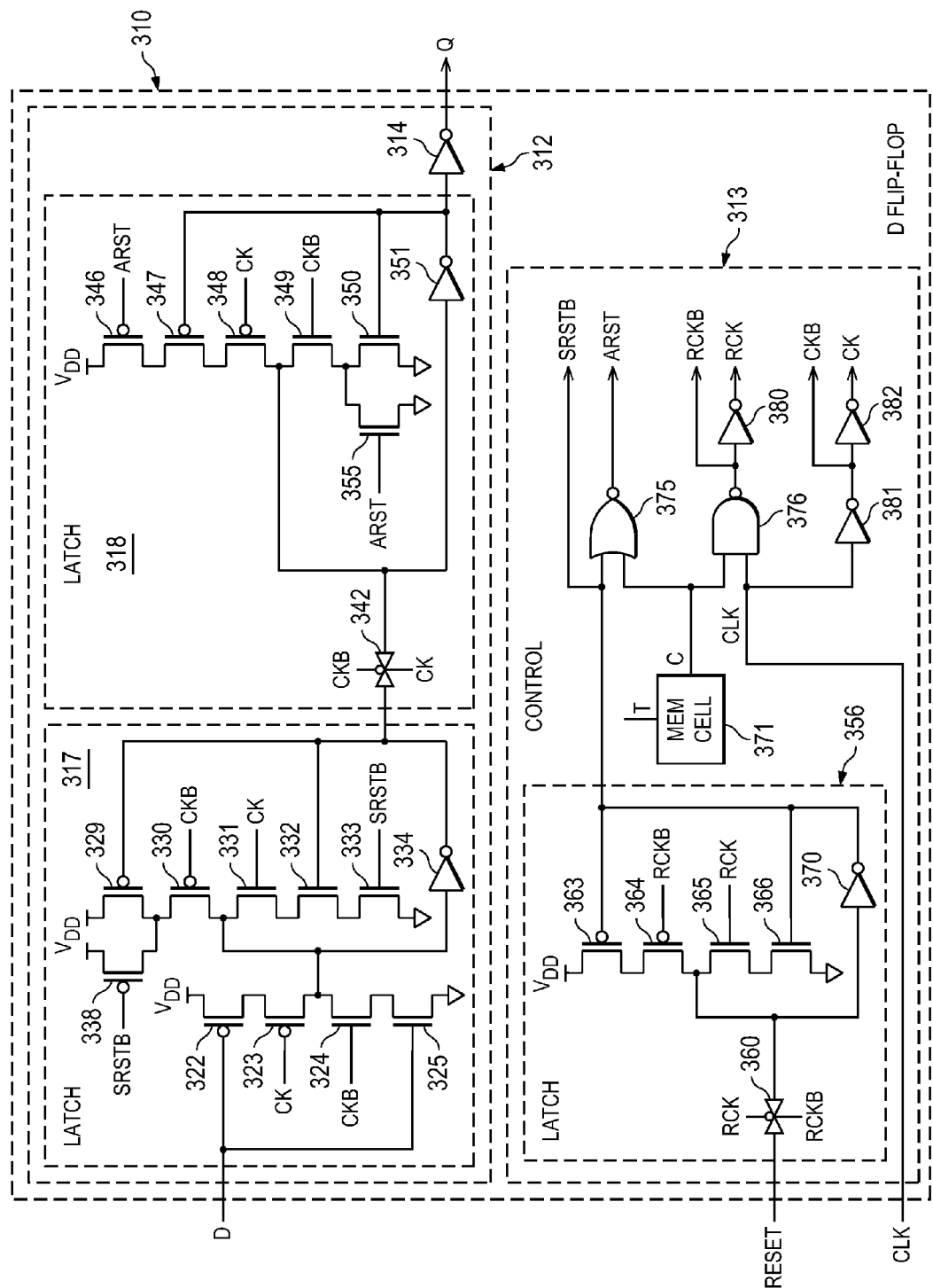
FIG. 3 is a circuit schematic showing a D flip-flop circuit.

FIG. 3 is a circuit schematic showing a D flip-flop circuit 310. In some embodiments, the D flip-flop circuit 310 may be an integral portion of each of the FPGA architectures of FIGS. 1 and 2. Note while some of the examples described herein relate to an FPGA, embodiments of the present invention may be used in any circuit or integrated circuit. The D flip-flop circuit 310 has a portion 312 and a control portion 313. The D flip-flop circuit 310 further has an input terminal D for a data input signal, an input terminal RESET for a RESET signal that is a control signal, an input terminal for a clock signal CLK, and an output terminal Q for a logical value. The portion 312 has an inverter 314 with an output that is coupled to the output terminal Q of the D flip-flop circuit 310. The portion 312 further includes sections that are latches 317 and 318 coupled in series.

The latch 317 has transistors 322-325 that are coupled in series between a direct current (DC) power source $V_{DD}$ and ground. Each of the transistors 322-325 has a gate terminal, a drain terminal, and a source terminal. The transistor 322 is a p-channel metal-oxide semiconductor (PMOS) transistor. The source terminal of the transistor 322 is coupled to the power source $V_{DD}$. The gate terminal of the transistor 322 is coupled to the input terminal D of the D flip-flop circuit 310. The transistor 323 is a PMOS transistor. The source terminal of the transistor 323 is coupled to the drain terminal of the transistor 322. The transistor 324 is an n-channel metal-oxide semiconductor (NMOS) transistor. The drain terminal of the transistor 324 is coupled to the drain terminal of the transistor 323. The transistor 325 is an NMOS transistor. The drain terminal of the transistor 325 is coupled to the source terminal of the transistor 324. The gate terminal of the transistor 325 is coupled to the input terminal D of the D flip-flop circuit 310. The source terminal of the transistor 325 is coupled to ground.

The latch 317 further has transistors 329-333 that are coupled in series between the power source $V_{DD}$ and ground. Each of the transistors 329-333 has a gate terminal, a drain terminal, and a source terminal. The transistor 329 is a PMOS transistor. The source terminal of the transistor 329 is coupled to the power source $V_{DD}$. The transistor 330 is a PMOS transistor. The source terminal of the transistor 330 is coupled to the drain terminal of the transistor 329. The transistor 331 is an NMOS transistor. The drain terminal of the transistor 331 is coupled to the drain terminals of the transistors 323 and 330. The transistor 332 is an NMOS transistor. The drain terminal of the transistor 332 is coupled to the source terminal of the transistor 331. The gate terminal of the transistor 332 is coupled to the gate terminal of the transistor 329. The transistor 333 is an NMOS transistor. The drain terminal of the transistor 333 is coupled to the source terminal of the transistor 332. The source terminal of the transistor 333 is coupled to ground.

In addition, the latch 317 has an inverter 334 with an input that is coupled the drain terminal of the transistor 331 and an output that is coupled to the gate terminal of the transistor 332. Further, the latch 317 has a PMOS transistor 338 that has a gate terminal, a drain terminal, and a source terminal. The source terminal of the transistor 338 is coupled to the power source $V_{DD}$. The drain terminal of the transistor 338 is coupled to the source terminal of the transistor 330.

Moving to the latch 318, the latch 318 has a transmission gate 342 with an input that is coupled to the output of the inverter 334. The latch 318 further includes transistors 346-350 that are coupled in series between the power source $V_{DD}$ and ground. Each of the transistors 346-350 has a gate terminal, a drain terminal, and a source terminal. The transistor 346 is a PMOS transistor. The source terminal of the transistor 346 is coupled to the power source $V_{DD}$. The transistor 347 is a PMOS transistor. The source terminal of the transistor 347 is coupled to the drain terminal of the transistor 346. The gate terminal of the transistor 347 is coupled to the input of the inverter 314. The transistor 348 is a PMOS transistor. The source terminal of the transistor 348 is coupled to the drain terminal of the transistor 347. The drain terminal of the transistor 348 is coupled to an output of the transmission gate 342. The transistor 349 is an NMOS transistor. The drain terminal of the transistor 349 is coupled to the drain terminal of the transistor 348. The transistor 350 is an NMOS transistor. The drain terminal of the transistor 350 is coupled to the source terminal of the transistor 349. The gate terminal of the transistor 350 is coupled to the input of the inverter 314. The source terminal of the transistor 350 is coupled to ground.

In addition, the latch 318 has an inverter 351. The input of the inverter 351 is coupled to the output of the transmission gate 342. The output of the inverter 351 is coupled to the input of the inverter 314. The latch 318 further includes an NMOS transistor 355 that has a gate terminal, a drain terminal, and a source terminal. The drain terminal of the transistor 355 is coupled to the source terminal of the transistor 349. The source terminal of the transistor 355 is coupled to ground.

Moving to the control portion 313, the control portion 313 has a section that is a latch 356. The latch 356 has a transmission gate 360 with an input that is coupled to the input terminal RESET of the D flip-flop circuit 310. The latch 356 further includes transistors 363-366 that are coupled in series between the power source $V_{DD}$ and ground. Each of the transistors 363-366 has a gate terminal, a drain terminal, and a source terminal. The transistor 363 is a PMOS transistor. The source terminal of the transistor 363 is coupled to the power source $V_{DD}$. The transistor 364 is a PMOS transistor. The source terminal of the transistor 364 is coupled to the drain terminal of the transistor 363. The drain terminal of the transistor 364 is coupled to an output of the transmission gate 360. The transistor 365 is an NMOS transistor. The drain terminal of the transistor 365 is coupled to the drain terminal of the transistor 364. The transistor 366 is an NMOS transistor. The drain terminal of the transistor 366 is coupled to the source terminal of the transistor 365. The gate terminal of the transistor 366 is coupled to the gate terminal of the transistor 363. The source terminal of the transistor 366 is coupled to ground. In addition, the latch 356 includes an inverter 370 with an input that is coupled to the drain terminal of the transistor 365 and an output that carries a control signal SRSTB and that is coupled to the gate terminals of the transistors 333, 338 and 366.

The control portion 313 has a portion that is a memory cell 371 and that is an operational mode storage element for storing an operational logical value that is a single binary bit. The memory cell 371 has a "true" output terminal T at which it outputs the logical value stored therein, and has a "complement" output terminal C for outputting the complement of the logical value. The control portion 313 further includes a section that is a two-input NOR gate 375 that functions as a control gate. One input of the NOR gate 375 is coupled to the output of the inverter 370 and the other input of the NOR gate 375 is coupled to the "complement" output terminal C of the memory cell 371. The output of the NOR gate 375 carries a control signal ARST and is coupled to the gates of the transistors 346 and 355. The control portion 313 further includes a two-input NAND gate 376 that is a clock gate. One of the inputs of the NAND gate 376 is coupled to the "complement" output terminal C of the memory cell 371 and the other of the inputs of the NAND gate 376 is coupled to the input terminal CLK of the D flip-flop circuit 310. The output of the NAND gate 376 carries a gated clock signal RCKB and is coupled to a control terminal of the transmission gate 360 and to the gate terminal of the transistor 364. In addition, the control portion 313 has an inverter 380 with an input that is coupled to the output of the NAND gate 376. Moreover, the inverter 380 has an output that carries a gated clock signal RCK and that is coupled to a control terminal of the transmission gate 360 and to the gate terminal of the transistor 365. The control portion 313 further has an inverter 381 with an input that is coupled to the input terminal CLK of the D flip-flop circuit 310 and an output that carries a signal CKB and is coupled to the gate terminals of the transistors 324, 330, and 349. The control portion 313 has an inverter 382 with an input that is coupled to the output of the inverter 381, and an output that carries a signal CK and that is coupled to the gate terminals of the transistors 323, 331, and 348, and to a control terminal of the transmission gate 342.

Now a discussion of the operation of the D-flip flop 310 is provided. Referring to FIG. 3, the portion 312 operates in synchronism with the clock signal CLK and maintains a logical value that appears at the output terminal Q of the D flip-flop circuit 310. In general, the logical value that is maintained in the portion 312 is a state of the data input signal that appeared at the input terminal D. For example, a data input signal appears at the input terminal D of the D flip-flop circuit 310. At the next rising edge of the clock signal CLK, the portion 312 accepts and maintains that state of the data input signal. This state of the data input signal maintained in the portion 312 is the logical value. Further, starting at that same rising edge of the clock signal CLK the logical value propagates through the portion 312 and appears at the output terminal Q. The propagation of the data input signal into the portion 312 and the operation of the portion 312 to maintain the logical value repeats with each rising edge of the clock signal CLK.

In more detail, the latches 317 and 318 operate in different states of the clock signal CLK to maintain the logical value that appears at the output terminal Q. When the clock signal CLK is high the logical value is maintained in the latch 317 and propagates through the transmission gate 342 and the inverters 351 and 314 to the output terminal Q. Moreover, when the clock signal CLK is low the logical value is maintained in the latch 318 and propagates through the inverter 314 to the output terminal Q.

A more detailed explanation of the operation of the portion 312 will now be provided. The signals CK and CKB from the portion 313 are the clock signals to the latches 317 and 318. The signal CKB is the inverse of the clock signal CLK from the input terminal CLK. The signal CK is the twice inverted clock signal CLK from the input terminal CLK. Therefore, the signal CK mirrors the clock signal CLK. Since it is understood that the signal CK mirrors the clock signal CLK and that the signal CKB is the inverse of the clock signal CLK, the discussion that follows simply refers to the clock signal CLK to facilitate an understanding of the operation of the portion 312.

When the clock signal CLK is high the pair of transistors 323 and 324 are both off, the pair of transistors 330 and 331 are both on, and the pair of transistors 348 and 349 are both off. Conversely, when the clock signal CLK is low, the pair of transistors 323 and 324 are both on, the pair of transistors 330 and 331 are both off, and the pair of transistors 348 and 349 are both on. When the transistors 323 and 324 are both off, the node between them is floating, and follows the node between the transistors 330 and 331, which are both on. Conversely, when the transistors 330 and 331 are both off, the node between them is floating and follows the node between the transistors 323 and 324. When the clock signal CLK is high the latch 317 latches and the latch 318 is transparent. When the clock signal CLK is low the latch 317 is transparent and the latch 318 latches. The transistors 333, 338, 346, and 355 are used when a reset occurs. In normal operation the transistors 333 and 346 are always on and the transistors 338 and 355 are always off. A more detailed discussion of the transistors 333, 338, 346, and 355 will be presented later.

For now, focus on the normal operation of the latch 317, and in particular the array of transistors 322-325 when the clock signal CLK is low. When the clock signal CLK is low, data from the data input terminal D enters into the latch 317 through the array of transistors 322-325. The array of transistors 322-325 inverts the data (as explained in more detail later) so that the data at the node between the drain terminals of the transistors 323 and 324 is the inverse of the data that entered the portion 312 at the node between the gate terminals of the transistors 322 and 325. The data then propagates through the inverter 334 to the other end of the latch 317 and to the gate terminals of the transistors 329 and 332. The data at the output of the inverter 334 and at the gate terminals of the transistors 329 and 332 mirrors the data that entered the portion 312 because it has been twice inverted, first by the array of transistors 322-325 and then second by the inverter 334. The data waits at the output of the inverter 334 and at the gate terminals of the transistors 329 and 332 until the clock signal CLK transitions from low to high, and at that point the data is latched into the latch 317.

When the clock signal CLK turns high, the transistors 323 and 324 turn off, and the array of transistors 322-325 inhibits data from entering the latch 317. Meanwhile, the transistors 330 and 331 turn on. The array of transistors 329-333 is enabled and the inverse of the state of the data at the gate terminals 329 and 332 appears at the node between the transistors 330 and 331 (as explained in more detail later). The state of the data at the node between the transistors 330 and 331 propagates through the inverter 334 so that the output of the inverter 334 mirrors the data that entered the portion 312. Thus, while the clock signal CLK is high, the data is maintained in the latch 317 and the latch is said to be latching.

In further detail, when the clock signal CLK is low, the transistors 323 and 324 are both on and the array of transistors 322-325 is enabled. One of the transistors 322 and 325 is always on while the other is always off, depending on the state of the data that appears at the input terminal D, and thus at the node between the gate terminals of the transistors 322 and 325. For example, when the state of the data from the input terminal D that appears at the node between the gate terminals of the transistors 322 and 325 is low, the transistor 322 is on because it is a PMOS transistor and the transistor 325 is off because it is an NMOS transistor. When the transistor 322 is on, the source and drain terminals of the transistor 322 are electrically coupled, thereby causing the drain terminal of the transistor 323 to be electrically coupled to the power source $V_{DD}$. Since the transistor 325 is off, the drain and source terminals of the transistor 325 are electrically decoupled so that an open circuit results between the drain terminal of the transistor 324 and ground. As a result, the node between the drain terminals of the transistors 323 and 324 is pulled high to the power source $V_{DD}$. Therefore, the state of the data that appears at the node between the drain terminals of the transistors 323 and 324 is high, and is the inverse of the low signal at the input terminal D.

On the other hand, when the state of the data from the input terminal D that appears at the node between the gate terminals of the transistors 322 and 325 is high, the transistor 322 is off because it is a PMOS transistor and the transistor 325 is on because it is an NMOS transistor. When the transistor 322 is off, the source and drain terminals of the transistor 322 are electrically decoupled so that an open circuit results between the drain terminal of the transistor 322 and the power source $V_{DD}$. Since the transistor 325 is on, the drain and source terminals of the transistor 325 are electrically coupled, thereby causing the drain terminal of the transistor 325 to be pulled low to ground. As a result, the node between the drain terminals of the transistors 323 and 324 is pulled low to ground. Therefore, the state of the data that appears at the node between the drain terminals of the transistors 323 and 324 is low, and thus the inverse of the high signal at the input terminal D.

When the clock signal CLK is high the transistor 323 is off because it is a PMOS transistor and the transistor 324 is off because it is an NMOS transistor. As a result, the source terminals of the transistors 323 and 324 are electrically decoupled, thereby causing an open circuit to result between the drain terminals of the transistors 322 and 325. Consequently, the data that appears at the node between the gate terminals of the transistors 322 and 325 is inhibited from propagating into the latch 317. Thus, the array of transistors 322-325 functions as a gate that inverts when it is enabled.

Now turn to the array of transistors 329-333 in the latch 317. As noted above, during normal operation the transistor 338 is always off, and the transistor 333 is always on. When the clock signal CLK is low, the transistor 330 is off because it is a PMOS transistor and the transistor 331 is off because it is an NMOS transistor. As a result, the array of transistors 329-333 is disabled and electrical energy is inhibited from flowing through the transistors 329-333. The state of the data at the node between the drain terminals of the transistors 323 and 324 propagates to the input of the inverter 334. The data then further propagates through the inverter 334 so that the state of the data that appears at the output of the inverter 334 is the twice inverted state of the data that entered the latch 317. As a result, the state of the data at the output of the inverter 334 mirrors the state of the data that entered the latch 317. This state propagates to the gate terminals of the transistors 329 and 332. Since the array of transistors 329-333 is disabled, this state waits at the gate terminals of the transistors 329 and 332 until the clock signal CLK goes high and the array of transistors 329-333 is enabled.

Now focus on the array of transistors 329-333 when the clock signal CLK is high and the array of transistors 329-333 is enabled. Recall that the transistors 333 and 338 are used for resets and that in normal operation, the transistor 333 is always on and the transistor 338 is always off. In other words, the drain of the transistor 333 is pulled low to ground and the drain terminal of the transistor 338 is electrically decoupled from the power source $V_{DD}$ so that an open circuit exists between the drain terminal of the transistor 338 and the power source $V_{DD}$. When the clock signal CLK is high, the transistor 330 is on because it is a PMOS transistor and the transistor 331 is on because it is an NMOS transistor. As a result, the array of transistors 329-333 is enabled.

When the array of transistors 329-333 is enabled, only one of the transistors 329 and 332 is on at any given, and the latch 317 latches in the state of the data that is waiting at the gate terminals of the transistors 329 and 332. For example, when the state of the data at the node between the gate terminals of the transistors 329 and 332 is low, the transistor 329 is on because it is a PMOS transistor and the transistor 332 is off because it is an NMOS transistor. When the transistor 329 is on, the source and drain terminals of the transistor 329 are electrically coupled, thereby causing the drain terminal of the transistor 329 to be electrically coupled to the power source $V_{DD}$. Since the transistor 332 is off, the drain and source terminals of the transistor 332 are electrically decoupled, thereby causing an open circuit between the drain terminal of the transistor 332 and ground. As a result, the node between the drain terminals of the transistors 330 and 331 is pulled high to the power source $V_{DD}$. Therefore, the state of the data that appears at the node between the drain terminals of the transistors 330 and 331 is high.

Now consider when the state of the data at the node between the gate terminals of the transistors 329 and 332 is high. The transistor 329 is off because it is a PMOS transistor and the transistor 332 is on because it is an NMOS transistor. When the transistor 329 is off, the source and drain terminals of the transistor 329 are electrically decoupled, thereby causing an open circuit between the drain terminal of the transistor 329 and the power source $V_{DD}$. When the transistor 332 is on, the drain and source terminals of the transistor 332 are electrically coupled, thereby causing the drain terminal of the transistor 332 to be pulled low to ground. As a result, the node between the drain terminals of the transistors 330 and 331 is pulled low to ground, and is the inverse of the high at the gate terminals of the transistors 329 and 332.

In addition, the state of the data that appears at the node between the drain terminals of the transistors 330 and 331 then propagates to the input terminal of the inverter 334. The state of the data at the input terminal of the inverter 334 then propagates through the inverter 334 so that the output of the inverter 334 carries the inverse of the state of the data at the node between the drain terminals of the transistors 330 and 331. Moreover, the state of the data that appears at the output of the inverter 334 then propagates to the gate terminals of the transistors 329 and 332 so that the array of transistors 329-333 maintains the state of the data that entered the latch 317.

Now turn to the operation of the latch 318. The latch 318 functions in a manner similar to the latch 317, with some differences. First, in comparison to the array of transistors 322-325, the transmission gate 342 is non-inverting and is enabled in the state of the clock signal CLK when the array of transistors 322-325 is disabled. For example, when the clock signal CLK is high, the transmission gate 342 enables the data at the output of the latch 317 to enter the latch 318. On the other hand, when the clock signal CLK is low, the transmission gate 342 inhibits the data in the latch 317 from entering the latch 318.

Another difference in the latch 318 is that the array of transistors 346-350 is enabled in a different state of the clock signal CLK than the array of transistors 329-333 in the latch 317. For example, when the clock signal CLK is high the transistor 348 is off because it is a PMOS transistor and the transistor 349 is off because it is an NMOS transistor. As a result, the array of transistors 346-350 is disabled when the clock signal CLK is high. On the other hand, when the clock signal CLK is low the transistor 348 is on because it is a PMOS transistor and the transistor 349 is on because it is an NMOS transistor. As a result, the array of transistors 346-350 is enabled when the clock signal CLK is low. Therefore, when the clock signal CLK is high, data waits at the gate terminals of the transistors 347 and 350 until the clock signal CLK goes low. When the clock signal CLK turns low, the state of the data waiting at the gate terminals of the transistors 347 and 350 is latched into the latch 318. In particular, the inverse of the state of the data waiting at the gate terminals of the transistors 347 and 350 appears at the node between the transistors 348 and 349 and propagates through the inverter 351, and is inverted again to the state of the data that was waiting at the gate terminals of the transistors 347 and 350. In this manner, the latch 318 maintains the data therein when the clock signal CLK is low.

Further detail of the operation of the latch 318 is provided. Focus on the operation of the latch 318 when the clock signal CLK is high and the array of transistors 346-350 is disabled. The transmission gate 342 is open and the output of the latch 317 propagates through the inverters 351 and 314 to the output terminal Q so that the state of the data in the latch 317 appears at the output terminal Q of the D flip-flop circuit 310. Turning to the array of transistors 346-350, the transistor 347 is off because it is a PMOS transistor and the transistor 348 is off because it is an NMOS transistor. As a result, the array of transistors 346-350 is disabled and electrical energy is inhibited from flowing through the transistors 346-350. The state of the data at the output of the transmission gate 342 propagates to the input of the inverter 351. The data then propagates through the inverter 351 so that the state of the data that appears at the output of the inverter 351 is the inverted state of the data that entered the latch 317. This state at the output of the inverter 351 then propagates to the gate terminals of the transistors 347 and 350. Since the array of transistors 346-350 is disabled, this state waits at the gate terminals of the transistors 347 and 350 until the clock signal CLK goes low and the array of transistors 346-350 is enabled.

Now focus on the operation of the latch 318 when the clock signal CLK transitions from high to low and the array of transistors 346-350 is enabled. Recall that the transistors 346 and 355 are used for resets and that in normal operation, the transistor 346 is always on and the transistor 355 is always off. In other words, the drain terminal of the transistor 346 is pulled high to the power source $V_{DD}$ and the drain terminal of the transistor 355 is electrically decoupled from ground so that an open circuit exists between the drain terminal of the transistor 355 and ground. When the clock signal CLK is low, the transistor 348 is on because it is a PMOS transistor and the transistor 349 is off because it is an NMOS transistor. As a result, the array of transistors 346-350 is enabled.

When the array of transistors 346-350 is enabled, only one of the transistors 347 and 350 is on at any given time, and the latch 318 latches in the state of the data that is waiting at the gate terminals of the transistors 347 and 350. For example, when the state of the data at the node between the gate terminals of the transistors 347 and 350 is low, the transistor 347 is on because it is a PMOS transistor and the transistor 350 is off because it is an NMOS transistor. When the transistor 347 is on, the source and drain terminals of the transistor 347 are electrically coupled, thereby causing the drain terminal of the transistor 347 to be electrically coupled to the power source $V_{DD}$. Since the transistor 350 is off, the drain and source terminals of the transistor 350 are electrically decoupled, thereby causing an open circuit between the drain terminal of the transistor 350 and ground. As a result, the node between the drain terminals of the transistors 348 and 349 is pulled high to the power source $V_{DD}$. Therefore, the state of the data that appears at the node between the drain terminals of the transistors 348 and 349 is high and is the inverse of the state of the data that appeared at the node between the gate terminals of the transistors 347 and 350.

Now consider when the state of the data at the node between the gate terminals of the transistors 347 and 350 is high. The transistor 347 is off because it is a PMOS transistor and the transistor 350 is on because it is an NMOS transistor. When the transistor 347 is off, the source and drain terminals of the transistor 347 are electrically decoupled, thereby causing an open circuit between the source terminal of the transistor 347 and the power source $V_{DD}$. When the transistor 350 is on, the drain and source terminals of the transistor 350 are electrical coupled, thereby causing the source terminal of the transistor 349 to be pulled low to ground. As a result, the node between the drain terminals of the transistors 348 and 349 is pulled low to ground. Therefore, the state of the data that appears at the node between the drain terminals of the transistors 348 and 349 is low and is the inverse of the state of the data that appeared at the node between the gate terminals of the transistors 347 and 350.

The state of the signal that appears at the node between the drain terminals of the transistors 348 and 349 then propagates to the input terminal of the inverter 351. The state of the data at the input terminal of the inverter 351 then propagates through the inverter 351 so that the output of the inverter 351 carries the inverse of the state of the data that appeared at the node between the drain terminals of the transistors 348 and 349. Moreover, the state of the data that appears at the output of the inverter 351 then propagates to the gate terminals of the transistors 347 and 350 so that the array of transistors 346-350 maintains the state of the data that entered the latch 317. In this manner, the latch 318 maintains the data therein when the clock signal CLK is low. Moreover, the state of the data that appears at the output of the inverter 351 further propagates through the inverter 314 to the output terminal Q and has the same state as the data from the input terminal D that previously entered into the latch 317 at the most recent rising edge of the clock signal CLK.

Now a brief summary of the normal operation of the portion 312 is provided. First consider when the clock signal CLK is low. Data from the data input terminal D enters into the latch 317, propagates through the inverter 334 to the gate terminals of the transistors 329 and 332 and to the output of the latch 317. The data at the gate terminals of the transistors 329 and 332 waits there until the array of transistors 329-333 is enabled. Meanwhile, the array of transistors 346-350 is enabled and the data is latched in the latch 318.

Now consider when the clock signal CLK transitions from low to high. Data from the data input terminal D is inhibited from passing into the latch 317. Meanwhile, the array of transistors 323-333 is enabled and the latch 317 latches and maintains the state of the data that was waiting at the gate terminals of the transistors 329 and 332. In addition, the transmission gate 342 conducts and enables the data that is maintained in the latch 317 to propagate through the latch 318 to the output terminal Q. The array of transistors 346-350 is disabled. Moreover, data from the latch 317 propagates to the gate terminals of the transistors 347 and 350 and waits there until the array of transistors 346-350 is enabled. The array of transistors 346-350 is enabled when the clock signal CLK transitions back to low, causing the data that waits at the gate terminals of the transistors 347 and 350 to be latched into and maintained in the latch 318.

Now an explanation of the operation of the control portion 313 is provided. The control portion 313 controls the portion 312 in response to a signal that appears at the input terminal RESET. For example, when that signal is low there is an absence of an occurrence of the RESET signal and the control portion 313 maintains the portion 312 in normal operation. However, when that signal is high there is an occurrence of the RESET signal and the control portion 313 resets the data maintained in the portion 312 to a binary "0."

The control portion 313 operates in one of two operational modes at any given time. One such operational mode is the asynchronous reset operational mode and the other such operational mode is the synchronous reset operational mode. In the asynchronous reset operational mode the control portion 312 immediately resets the logical value maintained in the portion 312 to "0" in response to an occurrence of the RESET signal. In particular, when the clock signal CLK is high the control portion 313 immediately forces the logical value maintained in the latch 317 to "0," and this "0" immediately propagates through the transmission gate 342 and the inverters 351 and 314 to the output terminal Q of the D flip-flop circuit 310. Likewise, when the clock signal CLK is low the control portion 313 immediately forces the logical value maintained in the latch 318 to "0," and this "0" immediately propagates through the inverters 351 and 314 to the output terminal Q of the D flip-flop circuit 310. In contrast, in the synchronous reset operational mode the control portion 313 resets the logical value maintained in the portion 312 at the next rising edge of the clock signal CLK in response to an occurrence of the RESET signal before that rising edge of the clock signal CLK. In particular, the control portion 313 forces the logical value maintained in the latch 317 to "0" at that rising edge of the clock signal CLK. At the next falling edge of the clock signal CLK the latch 318 latches in that "0", so that the logical value maintained in the portion 312 remains at "0."

The mode of operation of the control portion 313 is determined by the state of the binary bit that is in the memory cell 371. When the binary bit in the memory cell 371 is a "1," the control portion 313 operates in the asynchronous reset operational mode. When the binary bit in the memory cell 371 is a "0," the control portion 313 operates in the synchronous reset operational mode. The "complement" output terminal C of the memory cell 371 carries the inverse state of the binary bit that is stored therein.

The latch 356 manages the signal that appears at the input terminal RESET. In response to that signal the control portion 313 supplies one or both of the control signals SRSTB and ARST that affect the portion 312. For example, the control signals SRSTB and ARST are high and low, respectively, in the absence of an occurrence of the RESET signal. When there is an occurrence of the RESET signal in the asynchronous reset operational mode, the control signals SRSTB and ARST are low and high, respectively. In the synchronous reset operational mode, when there is an occurrence of the RESET signal during the low state of the clock signal CLK, at the next rising edge of the clock signal CLK the control signals SRSTB and ARST are both low.

In more detail, turn to the operation of the latch 356 in the asynchronous reset operational mode. The latch 356 is controlled by the gated clock signals RCKB and RCK. In the asynchronous reset operational mode the "complement" output terminal C of the memory cell 371 carries a binary "0" that is gated with the clock signal CLK at the NAND gate 376. As a result, in the asynchronous reset operational mode the output of the NAND gate 376 carries a gated clock signal RCKB that is always high and that appears at the input of the inverter 380 so that the output of the inverter 380 is a gated clock signal RCK that is always low. Consequently, the transmission gate 360 is always conducting and the array of transistors 363-366 is always off, thereby causing the latch 356 to be transparent in both states of the clock signal CLK. In other words, a signal that appears at the input terminal RESET enters the latch 356 and immediately propagates therethrough without regard to the state of the clock signal CLK.

Now turn to the operation of the latch 356 in the synchronous reset operational mode. The latch 356 operates in a manner similar to the latches 317 and 318, with some differences. For example, the transmission gate 360 is enabled in the same state of the clock signal CLK as the array of transistors 322-325 in the latch 317, but is non-inverting like the transmission gate 342. Moreover, the array of transistors 363-366 operate in the same state of the clock signal CLK as the array of transistors 329-333 in the latch 317.

In the synchronous reset operational mode the "complement" output terminal C of the memory cell 371 carries a binary "1" that is gated with the clock signal CLK at the NAND gate 376. As a result, in the synchronous reset operational mode the output of the NAND gate 376 is a gated clock signal RCKB that carries the inverse of the clock signal CLK and that appears at the input of the inverter 380 so that the output of the inverter 380 carries a gated clock signal RCK that is the twice inverted clock signal CLK and thus, mirrors the clock signal CLK. Therefore, in the synchronous reset operational mode, since it is understood that the gated clock signal RCK mirrors the clock signal CLK and that the gated clock signal RCKB is the inverse of the clock signal CLK, the discussion that follows simply refers to the clock signal CLK to facilitate an understanding of the operation of the portion 313.

When the clock signal CLK is low the signal that appears at the input terminal RESET propagates into the latch 356, through the inverter 370, and to the gate terminals of the transistors 363 and 366. Since the clock signal CLK is low, the array of transistors 363-366 is disabled and the inverse of the signal that appears at the input terminal RESET waits at the gate terminals of the transistors 363 and 366 until the array of transistors 363-366 is enabled. When the clock signal CLK transitions from low to high the transmission gate 360 inhibits the signal that appears at the input terminal RESET from entering the latch 356. Meanwhile, the array of transistors 363-366 is enabled and the state of the signal waiting at the gate terminals of the transistors 363-366 is latched into the latch 356.

Now a more detailed explanation of the operation of the control portion 313 in the asynchronous reset operational mode is provided. Recall that the binary bit in the memory cell 371 is a "1." Thus, the "complement" output terminal C of the memory cell 371 carries a "0" that propagates to an input of the NAND gate 376. In turn, the output of the NAND gate 376 carries a gated clock signal RCKB that is always a "1" regardless of the state of the clock signal CLK that appears at the other input of the NAND gate 376. This "1" then propagates to the input of the inverter 380 and thus, the output of the inverter 380 carries a gated clock signal RCK that is always a "0." The states of the gated clock signals RCKB ("1") and RCK ("0") then propagate to the control terminals of the transmission gate 360, thereby causing the transmission gate 360 to always be on. Moreover the states of the gated clock signals RCKB ("1") and RCK ("0") propagate to the gate terminals of the transistors 364 and 365, respectively. As a result, the transistor 364 is always off since it is a PMOS transistor, and the transistor 365 is always off since it is an NMOS transistor. The source terminals of the transistors 364 and 365 are electrically decoupled, thereby resulting in an open circuit between the drain and source terminals of the transistors 363 and 366. Consequently, in the asynchronous reset operational mode the transmission gate 360 is always enabled so that the latch 356 is always transparent, and the array of transistors 363-366 is always disabled.

A signal that appears at the input terminal RESET enters the latch 356 and passes therethrough while being inverted by the inverter 370. As a result, the output of the inverter 370 carries the inverse of the signal that appeared at the input terminal RESET. That inverted signal then propagates to the gate terminals of the transistors 363 and 366 and to an input of the NOR gate 375. Meanwhile, the "0" from the "complement" output terminal C of the memory cell 371 propagates to the other input of the NOR gate 375. Accordingly, the NOR gate 375 is enabled and inverts the signal from the inverter 370. As a result, the output of the NOR gate 375 carries the twice inverted signal that appeared at the input terminal RESET. In summary, in the asynchronous reset operational mode, the output of the NOR gate 375 carries a control signal ARST that mirrors the signal that appears at the input terminal RESET. Moreover, the output of the inverter 370 carries a control signal SRSTB that is the inverse of the signal that appears at the input terminal RESET.

Staying in the asynchronous reset operational mode, now focus on the operation of the control portion 313 when there is an occurrence of the RESET signal. Recall that the signal that appears at the input terminal RESET is high ("1"). The state of the control signal ARST is high ("1") because it mirrors that high signal that appears at the input terminal RESET. The state of the control signal SRSTB is low ("0") because it is the inverse of the high signal that appears at the input terminal RESET. The states of the control signals SRSTB ("0") and ARST ("1") propagate to the portion 312. When the clock signal CLK is high, the control signal SRST forces the state of the data maintained in the latch 317 to "0." When the clock signal CLK is low, the control signal ARST forces the state of the data maintained in the latch 318 to "0."

First consider the propagation of the state of the control signal SRSTB ("0") to the gate terminals of the transistors 333 and 338. The transistor 333 is turned off because it is an NMOS transistor, thereby electrically decoupling the drain and source terminals of the transistor 333 so that an open circuit results between the source terminal of the transistor 332 and ground. The transistor 338 is turned on because it is a PMOS transistor, thereby electrically coupling the node between the drain terminal of the transistor 329 and the source terminal of the transistor 330 to the power source $V_{DD}$. As a result, that node is pulled high to the power source $V_{DD}$. This has no impact on the function of the latch 317 when the clock signal CLK is low and the array of transistors 329-333 is disabled. However, when the clock signal CLK is high and the array of transistors 329-333 is enabled, the source and drain terminals of the transistors 330 are electrically coupled, and thus the node between the drain terminals of the transistors 330 and 331 is pulled high to the power source $V_{DD}$ through the transistor 338. As a result, a "1" propagates from the node between the drain terminals of the transistors 330 and 331 to the input of the inverter 334. In turn, the output of the inverter 334 carries a "0" that propagates through the transmission gate 342 and the inverters 351 and 314 to the output terminal Q. In addition, the "0" from the output of the inverter 334 propagates to the gate terminals of the inverters 329 and 332, thereby causing a "1" to appear at the node between the drain terminals of the transistors 330 and 331 as explained in detail above. This "1" then propagates to the input of the inverter 334 so that the output of the inverter carries a "0" back to the gate terminals of the transistors 329 and 332 and through the transmission gate 342 to the output terminal Q. In this manner, the bit latched in the latch 317 is forced to a "0" and the output terminal Q is set to "0." When the clock signal CLK then changes from high to low, the "0" shifts from the latch 317 to the latch 318, and continues to be supplied by the latch 318 to the Q output of the flip-flop.

Now consider the propagation of the state of the control signal ARST to the portion 312. In particular, the state of the control signal ARST ("1") propagates to the gate terminals of the transistors 346 and 355. The transistor 346 is turned off because it is a PMOS transistor, thereby electrically decoupling the source and drain terminals of the transistor 346 so that an open circuit results between the source terminal of the transistor 347 and the power source $V_{DD}$. The transistor 355 is turned on because it is an NMOS transistor, thereby electrically coupling the drain terminal of the transistor 355 to ground. As a result, the node between the source terminal of the transistor 349 and the drain terminal of the transistor 350 is pulled low to ground. This has no impact on the function of the latch 318 when the clock signal CLK is high and the array of transistors 346-350 is disabled. However, when the clock signal CLK is low and the array of transistors 346-350 is enabled, the drain and source terminals of the transistor 349 are electrically coupled so that the node between the drain terminals of the transistors 348 and 349 is pulled low to ground through the transistor 355. As a result, a "0" propagates from the node between the drain terminals of the transistors 348 and 349 to the input of the inverter 351. In turn, the output of the inverter 351 carries a "1" that propagates to the input of the inverter 314 so that the output of the inverter 314 is a "0" that then propagates to the output terminal Q. In addition, the "1" from the output of the inverter 351 propagates to the gate terminals of the transistors 347 and 350, thereby causing a "0" to appear at the node between the drain terminals of the transistors 348 and 349 as explained in detail above. This "0" then propagates to the input of the inverter 351 so that the output of the inverter carries a "1" back to the gate terminals of the transistors 347 and 350 and to the input of the inverter 314 so that the output of the inverter 314 is a "0" that propagates to the output terminal Q. In this manner, the bit latched in the latch 318 is forced to a "1" and the output terminal Q is set to "0."

Now turn to the operation of the control portion 313 in the synchronous reset operational mode. Recall that the binary bit in the memory cell 371 is a "0." The "complement" output terminal C of the memory cell 371 carries a "1" that propagates to an input of the NAND gate 376. Thus, the output of the NAND gate 376 carries a gated clock signal RCKB that is always the inverse of the clock signal CLK that is supplied to the other input of the NAND gate 376. The gated clock signal RCKB then propagates to the input of the inverter 380 and thus, the output of the inverter 380 carries a gated clock signal RCK that is the twice inverted clock signal CLK. Therefore, the gated clock signal RCK mirrors the clock signal CLK. Since it is understood that in the synchronous reset operational mode the gated clock signal RCK mirrors the clock signal CLK and that the gated clock signal RCKB is the inverse of the clock signal CLK, the discussion that follows simply refers to the clock signal CLK to facilitate an understanding of the operation of the control portion 313 in the synchronous reset operational mode. In addition, the "1" from the "complement" output terminal C of the memory cell 371 propagates to an input of the NOR gate 375. Thus, the output of the NOR gate 375 is always a "0" regardless of the output of the inverter 370 that appears at the other input of the NOR gate 375.

When the clock signal CLK is low the signal that appears at the input terminal RESET propagates into the latch 317, through the inverter 370, and to the gate terminals of the transistors 363 and 366. Since the clock signal CLK is low, the array of transistors 363-366 is disabled and the inverse of the signal that appears at the input terminal RESET waits at the gate terminals of the transistors 363 and 366 until the array of transistors 363-366 is enabled. When the clock signal CLK transitions from low to high the transmission gate 360 inhibits the signal that appears at the input terminal RESET from entering the latch 356. Meanwhile, the array of transistors 363-366 is enabled and the state of the signal that was waiting at the gate terminals of the transistors 363-366 is latched into the latch 356.

Staying in the synchronous reset operational mode, focus on the operation of the control portion 313 in the absence of an occurrence of the RESET signal. Recall that the signal that appears at the input terminal RESET is low ("0"). When the clock signal CLK is low, that low RESET signal passes through the conducting transmission gate 360 and through the inverter 370 so that a "1" appears at the output of the inverter 370. That "1" propagates to the gate terminals of the transistors 363 and 366 where it waits until the clock signal CLK transitions from low to high and the array of transistors 363-366 is enabled. Moreover, the "1" from the output of the inverter 370 propagates as the control signal SRSTB to the gate terminals of the transistors 333 and 338 in the latch 317. As explained above, the latch 317 operates normally when the control signal SRSTB is high. Meanwhile, the "0" from the output of the NOR gate 375 propagates as the control signal ARST to the gate terminals of the transistors 346 and 355. As explained above, the latch 318 operates normally when the control signal ARST is low.

When the clock signal CLK transitions from low to high the array of transistors 363-366 is enabled and the "1" that appears at the gate terminals of the transistors 363 and 366 is latched in the latch 356. In particular, the node between the drain terminals of the transistors 364 and 365 is a "0" that propagates to the input of the inverter 370 so that the output of the inverter "370" carries a "1" that propagates back to the gate terminals of the transistors 364 and 365, and propagates further as the control signal SRSTB to the gate terminals of the transistors 333 and 338 in the latch 317. Recall that the portion 312 operates normally when the control signal SRSTB is high ("1") and the control signal ARST is low ("0"). Thus, in the absence of an occurrence of the RESET signal in the synchronous reset operational mode, the control portion 313 controls the portion 312 in a manner similar to how the control portion 313 controls the portion 312 in the asynchronous reset operational mode in the absence of an occurrence of the RESET signal.

Staying in the synchronous reset operational mode, focus on the operation of the control portion 313 when there is an occurrence of the RESET signal, such that the signal that appears at the input terminal RESET is high ("1"). When the clock signal CLK is low, the "1" from the input terminal RESET passes through the conducting transmission gate 360 and through the inverter 370 so that a "0" appears at the output of the inverter 370. That "0" propagates to the gate terminals of the transistors 363 and 366 where it waits until the clock signal CLK transitions from low to high and the array of transistors 363-366 is enabled. Moreover, the "0" from the output of the inverter 370 propagates as the control signal SRSTB to the gate terminals of the transistors 333 and 338 in the latch 317. However, since the array of transistors 329-333 is disabled in the low state of the clock signal CLK, no reset occurs in the latch 317 at that point in time. With respect to the activity in latch 318, recall that the output of the NOR gate 375 is always a "0" in the synchronous reset operational mode, and thus the state of the control signal ARST that propagates to the gate terminals of the transistors 346 and 355 is low. As explained above, the latch 318 operates normally when the control signal ARST is low and thus maintains the logical value in the portion 312.

In the synchronous reset operational mode, reset occurs in the portion 312 when the clock signal transitions from low to high. In particular, reset occurs in the latch 317. For example, when the clock signal CLK transitions from low to high the array of transistors 363-366 is enabled and the "0" that appears at the gate terminals of the transistors 363 and 366 is latched in the latch 356. The node between the drain terminals of the transistors 364 and 365 is a "1" that propagates to the input of the inverter 370 so that the output of the inverter "370" carries a "0" that propagates back to the gate terminals of the transistors 364 and 365, and propagates further as control signal SRSTB to the gate terminals of the transistors 333 and 338. The array of transistors 329-333 is enabled as the clock signal CLK transitions from low to high, and the node between the drain terminals of the transistors 330 and 331 is forced to a "1". As a result, the "1" from that node propagates to the input of the inverter 334. The output of the inverter 334 is a "0" that propagates back to the gate terminals of the transistors 329 and 332 so that the "0" is latched in the latch 317. Moreover, the "0" from the output of the inverter 334 propagates through the transmission gate 342 and is twice inverted through the inverters 351 and 314 so that a "0" appears at the output terminal Q. In this manner, the control portion 313 resets the logical value maintained in the portion 312 to a "0."

In addition, the "1" from the output of the inverter 351 propagates to the gate terminals of the transistors 347 and 350 where it waits until the next falling edge of the clock signal CLK when the array of transistors 346-350 is enabled. At that next falling edge of the clock signal CLK the latch 318 latches in the "1" from the output of the inverter 351 so that the reset state is maintained in the portion 312 when the clock signal CLK goes low. The "1" maintained in the latch 318 propagates to the input of the inverter 314. Thus, the output of the inverter 314 carries a "0" that propagates to the output terminal Q.

Figure 4:
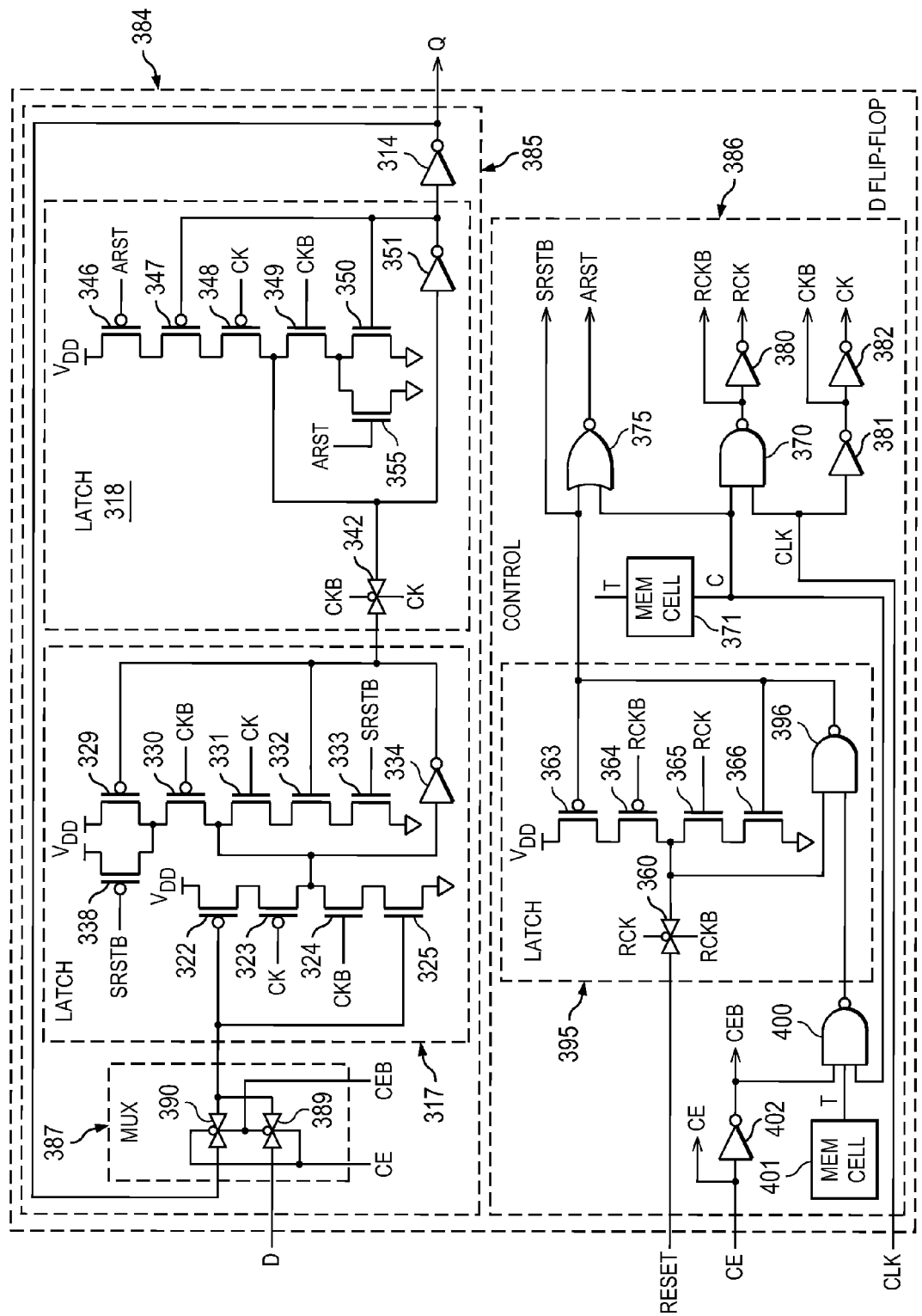
FIG. 4 is a circuit schematic showing a D flip-flop circuit that is an alternative embodiment of the D flip-flop circuit shown in FIG. 3.

FIG. 4 is a circuit schematic showing a D flip-flop circuit 384 that is an alternative embodiment of the D flip-flop circuit 310 shown in FIG. 3. Identical or equivalent elements are identified by the same reference numerals, and the following discussion focuses primarily on the differences. The D flip-flop circuit 384 includes a portion 385 that replaces the portion 312 (FIG. 3), a control portion 386 that replaces the control portion 313, and an input terminal CE for a clock enable signal CE.

The portion 385 includes the latches 317 and 318, and also a two-to-one multiplexer (MUX) 387. The multiplexer 387 includes a transmission gate 389. The input terminal D is coupled to an input of the transmission gate 389. In addition, the transmission gate 389 has an output that is coupled to the gate terminal of the transistor 322, a control terminal that is coupled to the input terminal CE of the D flip-flop circuit 384, and a further control terminal. The multiplexer 387 further includes a transmission gate 390 that has an output coupled to the gate terminal of the transistor 322. Moreover, the output terminal Q of the D flip-flop circuit 384 is coupled to an input of the transmission gate 390. Also, the transmission gate 390 has a control terminal that is coupled to the input terminal CE of the D flip-flop circuit 384, and a further control terminal that is coupled to a control terminal of the transmission gate 389.

Moving to the control portion 386, the control portion 386 has a latch 395. The latch 395 differs from the latch 356 of FIG. 3 in that it has a two-input NAND gate 396 that replaces the inverter 370. The output of the transmission gate 360 is coupled to an input of the NAND gate 396. Moreover, the NAND gate 396 has an output that is coupled to the gate terminal of the transistor 366.

The control portion 386 includes a three-input NAND gate 400 with an output that is coupled to an input of the NAND gate 396. Also, the "complement" output terminal C of the memory cell 371 is coupled to an input of the NAND gate 400. The control portion 386 further has a memory cell 401 that is a priority storage element for storing a priority logical value that is a single binary bit. The memory cell 401 has a "true" output terminal T at which it outputs the logical value stored therein. The "true" output terminal T of the memory cell 371 is coupled to an input of the NAND gate 400. In addition, the control portion 386 has an inverter 402 with an input that is coupled to the input terminal CE of the D flip-flop circuit 384, and an output that is coupled to an input of the NAND gate 400 and to the further control terminals of the transmission gates 389 and 390.

Now a discussion of the operation of the D flip-flop circuit 384 is provided. The D flip-flop circuit 384 operates in a manner similar to the D flip-flop circuit 310 shown in FIG. 3. The following discussion focuses primarily on the differences. Referring to FIG. 4, the D flip-flop circuit 384 adds circuitry to enable and disable the clock signal CLK and to select the priority of an occurrence of the RESET signal with respect to the clock signal CLK being disabled. When the clock enable signal CE is high it is actuated and enables the clock signal CLK, and the D flip-flop circuit 384 responds to a signal that appears at the input terminal RESET in a manner similar to how the D flip-flop circuit 310 (FIG. 3) responds to a RESET signal. When the clock enable signal CE is low it is deactuated to disable the clock signal CLK, and the D flip-flop circuit 384 behaves differently than the D flip-flop circuit 310. For example, when the clock enable signal CE is low, in the absence of an occurrence of the RESET signal, the D flip-flop circuit 384 maintains therein the state of the logical value that was present at the output terminal Q when the clock enable signal CE turned low. When there is an occurrence of the RESET signal and the clock enable signal CE is low, the D flip-flop circuit 384 resets the logical value being maintained in the D flip-flop 384 unless the memory cell 371 has put the control portion 386 in the synchronous reset operational mode, and the memory cell 401 has given the clock enable signal CE priority over an occurrence of the RESET signal. In that situation, reset is delayed until the clock enable signal CE goes high during the occurrence of that RESET signal. Moreover, until the clock enable signal CE goes high, the portion 385 maintains therein the state of the logical value that was present at the output terminal Q when the clock enable signal CE turned low.

Now, a more detailed explanation of the portion 385 in normal operation is provided. The multiplexer 387 passes to the latch 317 only one of two signals at any given time, depending on the state of the clock enable signal CE. When the clock enable signal CE is high the transmission gate 389 is conducting and the transmission gate 390 is non-conducting. As a result, a data input signal from the input terminal D propagates through the transmission gate 389 to the latch 317 while the logical value at the output terminal Q is inhibited from passing through the transmission gate 390 to the latch 317. On the other hand, when the clock enable signal CE is low the transmission gate 389 is non-conducting and the transmission gate 390 is conducting. As a result, a data input signal from the input terminal D is inhibited from propagating through the transmission gate 389 to the latch 317, while the logical value at the output terminal Q propagates through the transmission gate 390 to the latch 317. It will be noted that feeding the Q output of the flip-flop back to its data input while the clock enable signal CE is low has the effect of maintaining the same logical value in the flip-flop without change, and is thus equivalent to an alternative approach where the clock signal is gated with the clock enable signal and then supplied to the flip-flop (such that flip-flop does not receive the clock signal while the clock enable signal CE is low).

Now an explanation of the operation of the control portion 386 is provided. The NAND gate 396 manages when an occurrence of the RESET signal can propagate through the control portion 386. In particular, if the control portion 386 is in the synchronous reset operational mode, the clock enable signal CE is low, and the clock enable signal CE has priority over an occurrence of the RESET signal, the NAND gate 400 disables the NAND gate 296, and the control portion 386 ignores an occurrence of the RESET signal until the clock enable signal CE goes high. Consequently, the portion 385 will operate normally and maintain therein the state of the logical value that was present at the output terminal Q when the clock enable signal CE turned low.

The priority of the clock enable signal CE with respect to an occurrence of the RESET signal is determined by the state of the binary bit that is in the memory cell 401. For example, when the state of the binary bit in the memory cell 401 is a "0," an occurrence of the RESET signal has priority over the clock enable signal CE and thus, the control portion 386 forces the logical value maintained in the portion 385 to a "0" in response to an occurrence of the RESET signal. In contrast, when the binary bit in the memory cell 401 is a "1," the clock enable signal CE has priority over an occurrence of the RESET signal, and thus the control portion 386 forces the logical value maintained in the portion 385 to a "0" in response to an occurrence of the RESET signal unless the clock enable signal is low and the control portion 386 is in the synchronous reset operational mode.

In further detail, first consider the operation of the control portion 386 in the absence of an occurrence of the RESET signal. In the absence of an occurrence of the RESET signal, when the clock enable signal CE is high the control portion 386 controls the portion 385 in the same manner as the control portion 313 controls the portion 312 in the same situation. However, in the absence of an occurrence of the RESET signal, when the clock enable signal CE is low the control portion 386 controls the portion 385 differently than how the control portion 313 controls the portion 312 in the same situation. In particular, the multiplexer 387 passes to the latch 317 the state of the logical value that was present at the output terminal Q when the clock enable signal CE turned low.

Referring to FIG. 4, the "0" from the input terminal RESET propagates to an input of the NAND gate 396 and thus, the output of the NAND gate 396 is a "1" without regard to the state of the signal that appears at the other input of the NAND gate 396. That "1" from the output of the NAND gate 396 appears at an input of the NOR gate 375 and appears as the control signal SRSTB at the gate terminals of the transistors 333 and 338 of the latch 317. Since one of the inputs of the NOR gate 375 is a "1," the output of the NOR gate 375 carries a "0" without regard to the state of the binary bit from the "complement" terminal C of the memory cell 371 that appears at the other input of the NOR gate 375. That "1" from the output of the NOR gate 375 appears at the gate terminals of the transistors 346 and 355 as the control signal ARST. The state of the control signal SRSTB is a "1," and the state of the control signal ARST is a "0." Thus, the portion 385 maintains a logical value therein for the same reasons discussed above with respect to the D flip-flop circuit 310 (FIG. 3). In particular, when the clock enable signal CE is high, the multiplexer 387 passes a data input signal into the portion 385 and a state of that data input signal is maintained therein. On the other hand, when the clock enable signal CE is low, the multiplexer 387 passes the state of the logical value that was present at the output terminal Q when the clock enable signal CE turned low. Moreover, the portion 385 maintains that state of the logical value.

Now turn to the operation of the control portion 386 when there is an occurrence of the RESET signal. The "1" that appears at the input terminal RESET propagates to an input of the NAND gate 396. Meanwhile, the state of the signal at that other input of the NAND gate 396 depends on the output of the NAND gate 400. The output of the NAND gate 400 depends on the state of the clock enable signal CE, the state of the binary bit that appears at the "true" output terminal T of the memory cell 401, and the state of the binary bit that appears at the "complement" output terminal C of the memory cell 371. In other words, when there is an occurrence of the RESET signal the state of the output of the NAND gate 396 depends on whether the clock enable signal CE is high or low, the priority of the clock enable signal CE with respect to an occurrence of the RESET signal, and whether the control portion 386 is in the asynchronous or synchronous reset operational mode.

First consider a situation when there is an occurrence of the RESET signal and when the control portion 386 operates in the asynchronous reset operational mode. Recall that a "1" appears at the input terminal RESET when there is an occurrence of the RESET signal and in the asynchronous reset operational mode the "complement" output terminal C of the memory cell 371 is a "0." That "0" from the "complement" output terminal C of the memory cell 371 appears at an input of the NAND gate 400. As a result, in the asynchronous reset operational mode the output of the NAND gate 400 is a "1" regardless of the state of the clock enable signal CE and the state of the binary bit stored in the memory cell 401. That "1" from the output of the NAND gate 400 appears at an input of the NAND gate 396 while the "1" from the input terminal RESET appears at the other input of the NAND gate 396. As a result, the RESET signal is inverted by the NAND gate 396 and the output of the NAND gate 396 is a "0" that appears at an input of the NOR gate 375 and appears as the control signal SRSTB at the gate terminals 333 and 338 of the latch 317. In addition, the "0" from the "complement" output terminal C of the memory cell 371 appears at the other input of the NOR gate 375 and thus, the NOR gate 375 acts as an inverter and the output of the NOR gate 371 is a "1" that appears at the gate terminals of the transistors 346 and 355 as the control signal ARST. Here the state of the control signal SRSTB is a "0" and the state of the control signal ARST is a "1" and thus, the control portion 386 forces the logical value maintained in the portion 385 to a "0". Thus, in the asynchronous reset operational mode and in response to an occurrence of the RESET signal the control portion 386 resets the logical value maintained in the portion 385 without regard to the state of the clock enable signal CE and without regard to the priority of the clock enable signal CE with respect to an occurrence of the RESET signal.

Now consider a situation when there is an occurrence of the RESET signal when the control portion 386 operates in the synchronous reset operational mode. Recall that a "1" appears at the input terminal RESET when there is an occurrence of the RESET signal and in the synchronous reset operational mode the "complement" output terminal C of the memory cell 371 carries a "1." The "1" from the "complement" output terminal C of the memory cell 371 appears at an input of the NAND gate 400. As a result, the output of the NAND gate 400 depends on the state of the clock enable signal CE and the state of the binary bit stored in the memory cell 401 (the priority of the clock enable signal CE with respect to an occurrence of the RESET signal).

Staying in the situation when there is an occurrence of the RESET signal when the control portion operates in the synchronous reset operational mode, first consider in that situation when either the clock enable signal CE is high or an occurrence of the RESET signal has priority over the clock enable signal CE. When either the clock enable signal CE is high (the output of the inverter 402 is a "0") or an occurrence of the RESET signal has priority over the clock enable signal CE (the state of the binary bit stored in the memory cell 401 is "0"), the output of the NAND gate 400 is a "1." That "1" appears at an input of the NAND gate 396 while the "1" from the input terminal RESET appears at the other input of the NAND gate 396. Thus, the output of the NAND gate 396 is a "0" that appears at an input of the NOR gate 375 and appears as the control signal SRSTB at the gate terminals of the transistors 333 and 338 of the latch 317. In addition, the "1" from the "complement" output terminal C of the memory cell 371 appears at the other input of the NOR gate 375. As a result, the output of the NOR gate 371 is a "0" that appears at the gate terminals of the transistors 346 and 355 as the control signal ARST. Here the states of the control signals SRSTB and ARST are "0" and thus, the control portion 386 forces the logical value maintained in the portion 385 to a "0" at the next rising edge of the clock signal CLK. Thus, in response to an occurrence of the RESET signal in the synchronous reset operational mode, when either the clock enable signal CE is high or an occurrence of the RESET signal has priority over the clock enable signal CE, the control portion 386 operates in a manner similar to the control portion 313 and resets the logical value maintained in the portion 385.

Staying in the situation when there is an occurrence of the RESET signal and when the control portion operates in the synchronous reset operational mode, now consider in that situation when the clock enable signal CE is low (the output of the inverter 402 is a "1") and the clock enable signal CE has priority over an occurrence of the RESET signal (the state of the binary bit stored in the memory cell 401 is a "1"). Also, recall that a "1" appears at the input terminal RESET when there is an occurrence of the RESET signal. Therefore, the "1" from the input terminal RESET, and the "1" from the "true" output terminal T of the memory cell 401, and the "1" from the output of the inverter 402 appear at respective inputs of the NAND gate 400. Accordingly, the output of the NAND gate 400 is a "0" that appears at an input of the NAND gate 396. As a result, the output of the NAND gate 396 is a "1" that appears at an input of the NOR gate 375 and appears as the control signal SRSTB at the gate terminals of the transistors 333 and 338 of the latch 317. Moreover, since a "1" appears at an input of the NOR gate 375, the output of the NOR gate 375 carries a "0" that appears as the control signal ARST at the gate terminals of the transistors 346 and 355 of the latch 318.

Here the states of the control signals SRSTB and ARST are "1" and "0," respectively and thus, the control portion 386 ignores the occurrence of the RESET signal and the portion 384 maintains the logical value that was present at the output terminal Q when the clock enable signal CE turned low. Therefore, in response to an occurrence of the RESET signal when the control portion 386 is in the synchronous reset operational mode, the clock enable signal CE is low, and the clock enable signal CE has priority over an occurrence of the RESET signal, the control portion 386 inhibits reset of the latch 317 and instead maintains the logical value at the output terminal Q that was present at the most recent time the clock enable signal CE turned low. In summary, in response to an occurrence of the RESET signal when the control portion 386 is in the synchronous reset operational mode, the control portion 386 resets the logical value maintained in the portion 385 unless the clock enable signal CE is low and has priority over an occurrence of the RESET signal.

Although selected embodiments have been illustrated and described in detail, it should be understood that a variety of substitutions and alterations are possible without departing from the spirit and scope of the present invention, as defined by the claims that follow.

What is claimed is:

1. A circuit comprising:
   a first portion operating in synchronism with a clock signal, and maintaining a logical value that can vary dynamically; and
   a second portion coupled to the first portion, having first and second operational modes, and having a third portion that causes the second portion to operate in a selected one of the first and second operational modes,
   wherein in the first operational mode the second portion responds to an occurrence of a control signal by forcing the logical value to a predetermined logical state in a manner asynchronous to the clock signal, and in the second operational mode the second portion responds to an occurrence of the control signal by forcing the logical value to the predetermined logical state in a manner synchronized with the clock signal.

2. The circuit according to claim 1,
   wherein the second portion includes a latch having an input to which the control signal is supplied and having an output coupled to the first portion;
   wherein in the first operational mode the second portion causes the latch to be transparent so that the control signal passes therethrough; and
   wherein in the second operational mode the second portion causes a state of the control signal to be latched in the latch in a manner synchronized with the clock signal.

3. The circuit according to claim 2,
wherein the third portion includes an operational mode storage element that maintains an operational logical value indicating which of the first and second operational modes the second portion should operate in; and
wherein the second portion includes a gate having inputs responsive to the output of the latch and the operational logical value, the gate having an output coupled to the first portion.

4. The circuit according to claim 1,
wherein the first portion includes an output terminal, and first and second sections that are coupled in series, wherein during a first state of the clock signal the first section maintains the logical value and supplies the logical value to the output terminal, and during a second state of the clock signal different from the first state the second section maintains the logical value and supplies the logical value to the output terminal;
wherein in the first operational mode, during the first state of the clock signal and in response to an occurrence of the control signal the second portion immediately forces the logical value maintained in the first section to the predetermined logical state, thereby causing the first section to supply the predetermined logical state to the output terminal, and during the second state of the clock signal and in response to an occurrence of the control signal the second portion immediately forces the logical value maintained in the second section to the predetermined logical state, thereby causing the second section to supply the predetermined logical state to the output terminal; and
wherein in the second operational mode, at a transition of the clock signal from the second state to the first state and in response to an occurrence of the control signal, the second portion forces the logical value maintained in the first section to the predetermined logical state, thereby causing the first section to supply the predetermined logical state to the output terminal.

5. The circuit according to claim 4,
wherein the second portion includes third and fourth sections;
wherein in the first operational mode, the control signal passes through the third section to the fourth section and, in response to an occurrence of the control signal during the first state of the clock signal the third section causes the logical value maintained in the first section to be immediately forced to the predetermined logical state, and in response to an occurrence of the control signal during the second state of the clock signal the fourth section causes the logical value maintained in the second section to be immediately forced to the predetermined logical state; and
wherein during the first state of the clock signal in the second operational mode, the third section inhibits the control signal from passing therethrough and the third section maintains therein the state that the control signal had at the most recent transition of the clock signal from the second state to the first state, and the third section causes the logical value maintained in the first section to be forced to the predetermined logical value when the state of the control signal maintained in the third section corresponds to an occurrence of the control signal.

6. The circuit according to claim 5,
wherein the first section includes a first latch and the second section includes a second latch, wherein during the second state of the clock signal the first latch is transparent and a data input signal passes therethrough, and a logical state of the data input signal is latched therein when the clock signal then transitions to the first state, the logical state latched in the first latch during the first state of the clock signal being the logical value;
wherein during the first state of the clock signal the second latch is transparent and the logical value latched in the first latch passes through the second latch to the output terminal, the second latch latching the logical value therein at a transition of the clock signal from the first state to the second state;
wherein the third section includes a third latch;
wherein in the first operational mode, the third latch is transparent and the control signal passes therethrough to the fourth section and in response to an occurrence of the control signal during the first state of the clock signal the third section causes the logical value latched in the first latch to be immediately forced to the predetermined logical state, and in response to an occurrence of the control signal during the second state of the clock signal the fourth section causes the logical value latched in the second latch to be immediately forced to the predetermined logical state; and
wherein during the first state of the clock signal in the second operational mode the third latch inhibits the control signal from passing therethrough and the third latch latches therein and passes to the fourth section the state that the control signal had at the most recent transition of the clock signal from the second state to the first state, and the third section causes the logical value latched in the first latch to be forced to the predetermined logical value when the state of the control signal latched in the third latch corresponds to an occurrence of the control signal at the most recent transition of the clock signal from the second state to the first state.

7. The circuit according to claim 6,
wherein the third portion includes an operational mode storage element that maintains an operational logical value, wherein a first state of the operational logical value causes the second portion to operate in the first operational mode, and a second state of the operational logical value causes the second portion to operate in the second operational mode;
wherein the fourth section includes a control gate responsive to the operational logical value and an output of the third latch;
wherein when the operational logical value is in the first state during the first operational mode, the control gate is enabled so that during the second state of the clock signal the control gate immediately forces the logical value latched in the second latch to the predetermined logical state in response to the occurrence of the control signal; and
wherein when the operational logical value is in the second state during the second operational mode the control gate is disabled.

8. The circuit according to claim 7,
wherein the second portion includes a clock gate responsive to the operational logical value and the clock signal;
wherein during the first and second states of the clock signal and in response to the first state of the operational logical value, the clock gate causes the third latch to be transparent so that the control signal passes therethrough; and
wherein during the first state of the clock signal and in response to the second state of the operational logical value, the clock gate causes the third latch to inhibit the control signal from passing therethrough and to latch therein the state that the control signal had at the most recent transition of the clock signal from the second state to the first state.

9. The circuit according to claim 8,
wherein the second portion is responsive to a clock enable signal, and a priority logical value having one of first and second states;
wherein when the priority logical value has the first state during the second operational mode, the second portion responds to the clock enable signal being deactuated by ignoring the control signal while the clock enable signal remains deactuated; and
wherein when the priority logical value has the second state during the second operational mode, the second portion responds to an occurrence of the control signal by forcing the logical value in the first portion to the predetermined logical state in a manner synchronized with the clock signal, without regard to the state of the clock enable signal.

10. The circuit according to claim 1,
wherein the second portion is responsive to a clock enable signal, and a priority logical value having one of first and second states;
wherein when the priority logical value has the first state during the second operational mode, the second portion responds to the clock enable signal being deactuated by ignoring the control signal while the clock enable signal remains deactuated; and
wherein when the priority logical value has the second state during the second operational mode, the second portion responds to an occurrence of the control signal by forcing the logical value in the first portion to the predetermined logical state in a manner synchronized with the clock signal, without regard to the state of the clock enable signal.

11. The circuit according to claim 10,
wherein the second portion includes a latch having an input to which the control signal is supplied and having an output coupled to the first portion;
wherein in the first operational mode the second portion causes the latch to be transparent so that the control signal passes therethrough;
wherein when the priority logical value has the first state during the second operational mode, the second portion responds to the clock enable signal being deactuated by disabling the latch while the clock enable signal remains deactuated so that the control signal is inhibited from passing through the latch; and
wherein when the priority logical value has the second state during the second operational mode, the second portion causes a state of the control signal to be latched in the latch in a manner synchronized with the clock signal.

12. The circuit according to claim 11,
wherein the third portion includes an operational mode storage element that maintains an operational logical value indicating which of the first and second operational modes the second portion should operate in;
wherein the second portion includes a priority storage element that maintains the priority logical value; and
wherein the second portion includes a gate having inputs responsive to the priority logical value, the operational logical value, and the clock enable signal, the gate having an output coupled to a disable input of the latch.

13. The circuit according to claim 12,
wherein when the priority logical value has the second state during the second operational mode the gate causes the second portion to force the logical value in the first portion to the predetermined logical state in response to an occurrence of the control signal;
wherein when the priority logical value has the first state during the second operational mode and in response to the clock enable signal being deactuated the gate inhibits the second portion from forcing the logical value in the first portion to the predetermined logical state in response to an occurrence of the control signal;
wherein when the priority logical value has the first state during the second operational mode and the clock enable signal is actuated the gate forces the logical value in the first portion to the predetermined logical state in response to an occurrence of the control signal; and
wherein in the first operational mode the gate causes the second portion to immediately force the logical value in the first portion to the predetermined logical state in response to an occurrence of the control signal.

14. The circuit according to claim 10,
wherein the first portion has an input, and has an output at which the logical value appears, the logical state present at the input being accepted by the first portion in synchronism with the clock signal and becoming the logical value; and
including a fourth portion responsive to the clock enable signal, the fourth portion responding to the clock enable signal being deactuated by coupling the output of the first portion to the input thereof while the clock enable signal remains deactuated, and responding to the clock enable signal being actuated by supplying a data input signal to the input of the first portion.

15. A method of operating a circuit that includes first and second portions, comprising:
operating the first portion in synchronism with a clock signal;
maintaining in the first portion a logical value that can vary dynamically; and
operating the second portion in a selected one of first and second operational modes, including:
responding to the occurrence of a control signal during operation in the first operational mode by causing the second portion to force the logical value in the first portion to a predetermined logical state in a manner asynchronous to the clock signal; and
responding to the occurrence of the control signal during operation in the second operational mode by causing the second portion to force the logical value in the first portion to the predetermined logical state in a manner synchronized with the clock signal.

16. The method according to claim 15,
wherein the responding in the second operational mode includes latching a state of the control signal in a latch in the second portion in a manner synchronized with the clock signal, the latch having an input to which the control signal is supplied and having an output coupled to the first portion; and
wherein the responding in the first operational mode includes causing the latch to be transparent so that the control signal passes therethrough.

17. The method according to claim 16, including maintaining an operational logical value in a third portion of the circuit, the operational logical value indicating in which of the first and second operational modes the second portion should operate, the second portion including a gate having inputs responsive to the output of the latch and the operational logical value, and having an output coupled to the first portion.

18. The method according to claim 15, wherein the responding in the second operational mode includes:
   delaying the causing of the second portion to force the logical value in the first portion to the predetermined logical state when a priority logical value has a first state and a clock enable signal is deactuated; and
   carrying out the causing of the second portion to force the logical value in the first portion to the predetermined logical state when the priority logical value has a second state different from the first state, without regard to the state of the clock enable signal.

19. The method according to claim 18,
   wherein the responding in the first operational mode includes causing a latch in the second portion to be transparent so that the control signal passes therethrough, the latch having an input to which the control signal is supplied and having an output coupled to the first portion;
   wherein the delaying includes disabling the latch while the clock enable signal remains deactuated so that the control signal is inhibited from passing through the latch; and
   wherein the carrying out includes causing a state of the control signal to be latched in the latch in a manner synchronized with the clock signal.

* * * * *